United States Patent
Ibata et al.

(10) Patent No.: US 6,825,748 B1
(45) Date of Patent: Nov. 30, 2004

(54) MODULE AND METHOD OF MANUFACTURE

(75) Inventors: Akihiko Ibata, Takaishi (JP); Michio Ooba, Kadoma (JP); Toshihiro Yoshizawa, Higashiosaka (JP)

(73) Assignee: Matsushita Electric Industrial Co., Ltd. (JP)

(*) Notice: Subject to any disclaimer, the term of this patent is extended or adjusted under 35 U.S.C. 154(b) by 241 days.

(21) Appl. No.: 09/423,806

(22) PCT Filed: Mar. 11, 1999

(86) PCT No.: PCT/JP99/01179

§ 371 (c)(1),
(2), (4) Date: Mar. 17, 2000

(87) PCT Pub. No.: WO99/46784

PCT Pub. Date: Sep. 16, 1999

(30) Foreign Application Priority Data

| Mar. 13, 1998 | (JP) | 10-062804 |
| Feb. 9, 1999 | (JP) | 11-030943 |
| Feb. 16, 1999 | (JP) | 11-036678 |
| Feb. 16, 1999 | (JP) | 11-036679 |

(51) Int. Cl.$^7$ ............................... H01F 5/00
(52) U.S. Cl. ............ 336/200; 336/192; 336/83; 336/232; 29/602.1
(58) Field of Search ................ 336/200, 192, 336/83, 232, 223; 333/184, 185; 29/602.1, 25.42

(56) References Cited

U.S. PATENT DOCUMENTS

| 4,322,698 | A | * | 3/1982 | Takahashi et al. ......... 29/602.1 |
| 5,197,170 | A | * | 3/1993 | Senda et al. ............... 29/25.42 |
| 5,476,728 | A | * | 12/1995 | Nakano et al. .......... 252/62.58 |
| 5,598,136 | A | * | 1/1997 | Kano et al. .................. 336/200 |
| 6,027,008 | A | * | 2/2000 | Toi et al. ................... 228/110.1 |
| 6,147,573 | A | * | 11/2000 | Kumagai et al. ............ 333/185 |

FOREIGN PATENT DOCUMENTS

| EP | 0 742 567 A1 | 11/1996 |
| JP | 57-39521 | 7/1980 |
| JP | 62-28891 | 4/1982 |
| JP | 59-24534 | 6/1984 |
| JP | 1-192107 | 8/1989 |
| JP | 4-14806 | 1/1999 |

* cited by examiner

Primary Examiner—Lincoln Donovan
Assistant Examiner—Jennifer A. Poker
(74) Attorney, Agent, or Firm—Parkhurst & Wendel, L.L.P

(57) ABSTRACT

A composite component including a helical strip and a plurality of terminals both made of a same conductor material, the helical strip formed in close contact with an external periphery of at least one capacitor constructed of at least one insulation layer and at least two electrode layers, wherein the helical axis of the helical conductor strip is parallel with the electrode layers composing the capacitor.

21 Claims, 9 Drawing Sheets

MODULE AND METHOD OF MANUFACTURE

FIELD OF THE INVENTION

The present invention relates to a composite component used for a variety of electronic devices and communication equipment. The invention also relates to a method of manufacturing the composite component.

BACKGROUND OF THE INVENTION

A variety of composite components including coils, capacitors, resistors, and like components are used widely for various electronic devices and communication equipment. Recently demand for miniaturized and thin composite components has risen. Additionally noise reduction functions of composite components have become more important for electronic devices which operate at higher frequencies and are digital.

There have been L/C composite components constructed by stacking a laminated coil and a laminated ceramic capacitor, such as those disclosed in Japanese Patent Examined Publications, Nos. S59-24534, and S62-28891, which are some examples of small size composite components of the prior art which have a noise reduction function. Furthermore, a variety of structures for L/C composite components have been disclosed in Japanese Patent Examined Publication, No. S62-28891, Japanese Patent Laid-open Publication, No. H01-192107, and so on, each teaching a variation in a three-dimensional arrangement of a coil and a capacitor.

Generally a composite component for noise reduction contains a filter circuit of L-type, T-type, π-type, or the like, comprising a combination of a plurality of coils and a plurality of capacitors. However, structures of laminated L/C composite components of the prior art have been such that they are capable of composing a filter circuit of only one type of the above circuits. A L/C composite component disclosed in Japanese Patent Examined Publication, No. S62-28891, for instance, has such structure that it can compose only a T-type filter.

Moreover, the conventional composite components had such problems with interference among coils constructed therein, and poor compatibility between coil material and capacitor material in a process of sintering. That is, there are differences in physical properties such as coefficient of thermal expansion, sintering characteristic, and so on, between magnetic material used for increasing a characteristic of the coils and the dielectric material constituting the capacitors. As a result, a defect such as a delamination, warpage, and the like often occurred during sintering process of the laminated composite components.

Since a priority has usually been placed for ensuring the compatibility between magnetic material and dielectric material in order to avoid the above-referred defects, neither material has been able to function effectively to the maximum extent of their properties. Also, there has been a limit in miniaturizing the conventional L/C composite components, since they are composed of laminated coils and laminated ceramic capacitors by stacking them one against another.

On the other hand, an L/C composite component of another type of structure has been suggested, in which a coated copper wire is wound around a laminated chip capacitor. However, this structure has a problem that it reduces yields in production of composite components, since it results in a large dispersion in characteristics of coils. Moreover, this structure has a difficulty in making connections between ends of the copper wire of the coil and terminals of the laminated chip capacitor, thereby making it difficult to miniaturize the L/C composite component or to form the L/C composite component into a chip component.

An object of the present invention is to provide a composite component having a new structure, which eliminates the above-described drawbacks of the conventional composite components, and a method of manufacturing the composite component.

Another object of the invention is to provide a composite component having a structure, which is so designed that the composite component containing various kinds of filter circuits can be manufactured easily and effectively with increased productivity and without making a substantial change in the manufacturing condition, and a method of manufacturing the composite component.

SUMMARY OF THE INVENTION

A composite component of the present invention comprises (1) a capacitor composed of at least one insulation layer and at least two electrode layers; and (2) a spiral strip of conductor and a plurality of terminals formed in close contact to an external peripheral surface of the capacitor or an external peripheral surface of a portion of the insulation layer not serving for the capacitor, wherein the electrode layers and the spiral strip of conductor are electrically connected to the plurality of terminals.

Another composite component of the present invention comprises (1) a spiral strip of conductor formed in close contact to an insulation body or a magnetic body, and (2) a capacitor composed of at least one insulation layer and at least two electrode layers, wherein the spiral strip of conductor and the capacitor are laminated one against another via an insulation layer placed between them; a spiral axis of the spiral strip of conductor is parallel with a plane of the electrode layer composing the capacitor; and, the electrode layers and the spiral strip of conductor are electrically connected.

A method of the present invention for manufacturing a composite component comprises:

(1) forming a capacitor comprising at least one insulation layer and at least two electrode layers;

(2) forming an additional insulation layer on an external peripheral surface of the insulation layer and the capacitor; and, (3) forming a spiral strip of conductor and a terminal on an external periphery of the capacitor covered by the additional insulation layer.

Another method of the present invention for manufacturing a composite component comprises:

(1) forming a capacitor comprising at least one insulation layer and at least two electrode layers provided on a portion of the insulation layer;

(2) forming an additional insulation layer on an external peripheral surface of the insulation layer and the capacitor; and, (3) forming a spiral strip of conductor and a terminal on an external periphery of the additional insulation layer.

Still another method of the present invention for manufacturing a composite component comprises:

(1) forming a capacitor comprising at least one insulation layer and at least two electrode layers;

(2) forming a spiral strip of conductor in close contact to an external periphery of an insulation body or a magnetic body; and, (3) laminating the capacitor and the insulation body or the magnetic body, on which the spiral strip of conductor is closely formed, via another insulation layer placed between them.

THE BEST MODE FOR CARRYING OUT THE INVENTION

Exemplary embodiments of the present invention will be described hereinafter by referring to the accompanying figures.

First Exemplary Embodiment

Figure 1:
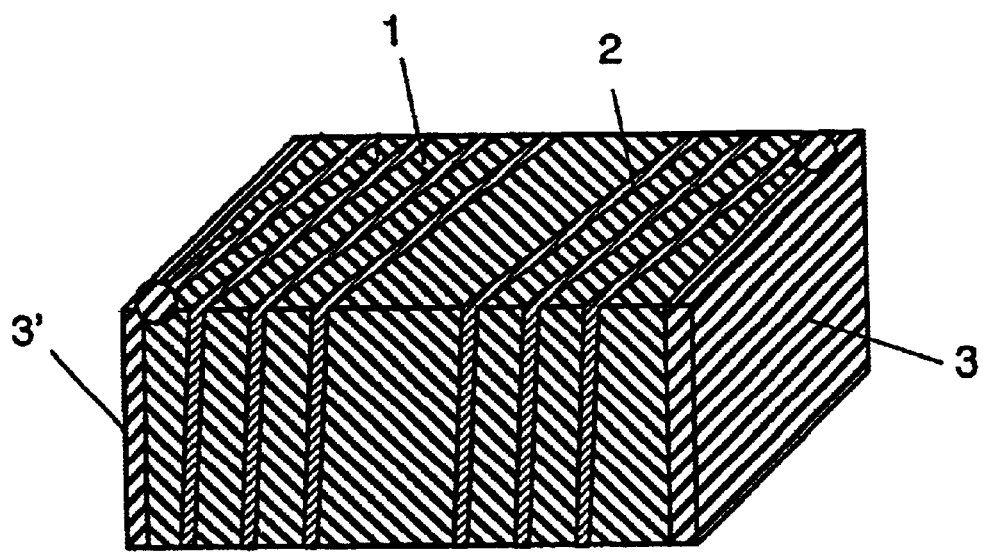
FIG. 1 is a typical external perspective view illustrating a composite component of a first exemplary embodiment of the present invention.

FIG. 1 illustrates an example of a schematic external appearance of a composite component of a first exemplary embodiment of the present invention. In particular, the composite component shown in FIG. 1 comprises a coil constructed of spiral conductor 2 adhering closely to a surface of a composite component 1.

A difference between the composite component of this invention and a composite component of the prior art constructed of a coated copper wire wound around a chip capacitor is that the spiral conductor 2 adheres closely to a substrate, since it is formed in a process of manufacturing the composite component.

Also, another difference of the composite component of this invention from a printed and laminated composite component of the prior art composed of a laminated coil and a laminated capacitor is that a spiral axis of the spiral conductor 2 is arranged to be parallel with "a plane of an electrode of a capacitor" or a flat surface of the electrode, so long as the axis of the coil is perpendicular to the flat surface comprising the electrode. This structure provides a superior characteristic for the coil that constitutes the composite component of this invention.

Furthermore, the composite component is provided on its side surfaces with a pair of terminals 3 and 3', which are formed at the same time with the spiral conductor 2, and are connected to the spiral conductor 2. The composite component internally contains a capacitor constructed of at least two electrode layers and at least one dielectric layer. The composite component may comprise an insulation layer formed on each of the upper and lower surfaces of the capacitor, when necessary.

In other words, FIG. 1 shows a composite component having a filter circuit in which a coil and a capacitor are connected in parallel.

Figure 2:
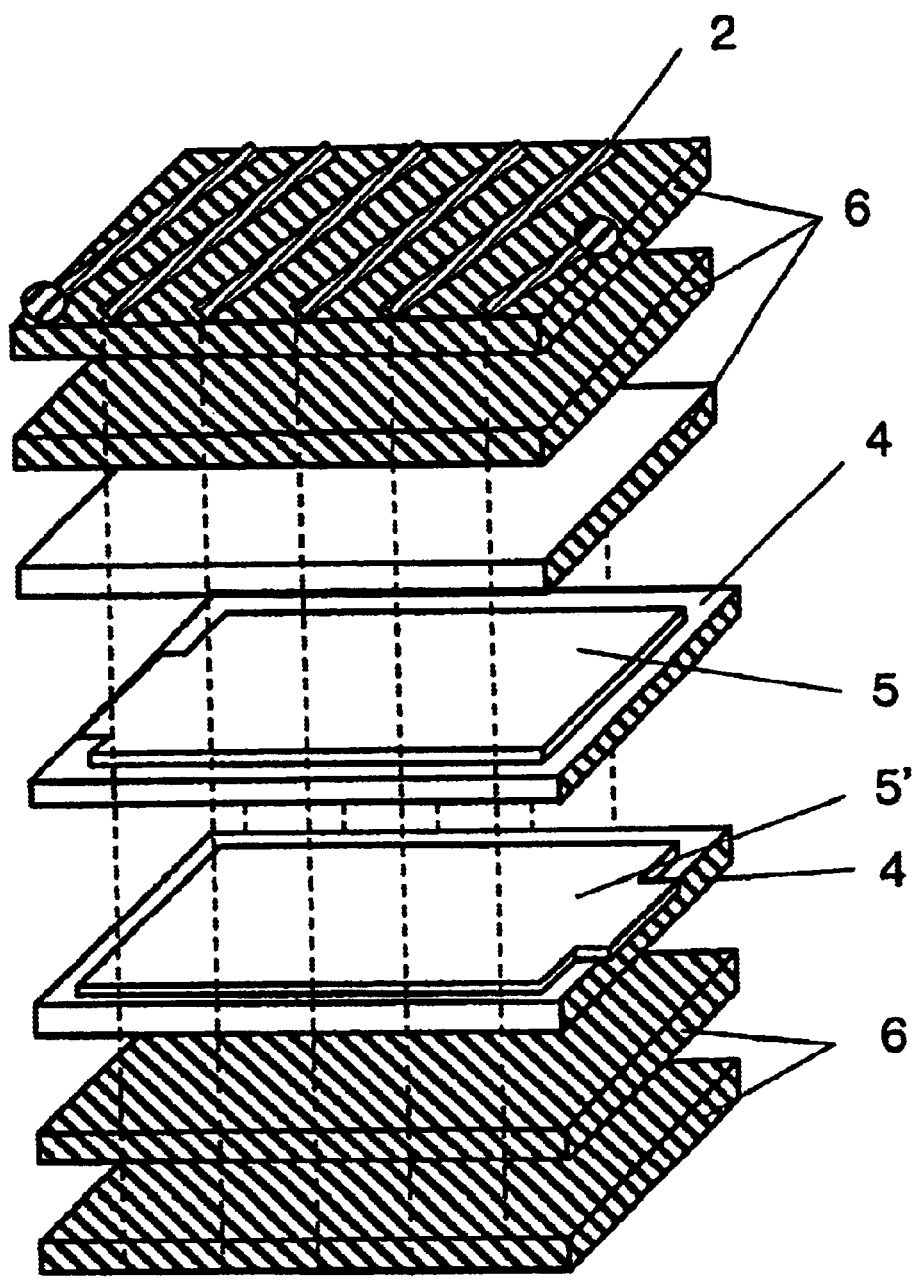
FIG. 2 is a schematic view illustrating a conceptional structure of the composite component of the first exemplary embodiment of the present invention.

FIG. 2 illustrates an interior structure of the composite component 1 shown in FIG. 1. The composite component 1 is constructed of a laminated structure comprising a capacitor composed of a dielectric layer 4 and a pair of electrode layers 5 and 5', and insulation layers 6 formed on an exterior of the capacitor and serving as a substratum of coil. The electrode layers 5 and 5' include their respective electrode portions, which are exposed at two opposite surfaces of the composite component. Incidentally, although FIG. 2 shows a plurality of the insulation layers 6, the plurality of them is unnecessary. However, at least one of the insulation layers is necessary as an outermost layer, in order to ensure isolation between the electrode layers 5 and 5' and the conductor 2 composing the coil.

It is generally useful to provide a plurality of the insulation layers 6 for a purpose of varying characteristics or improving performance of the coil constructed on an exterior surface of the composite component 1, besides ensuring the isolation between the coil and the electrode layers 5 and 5' of the capacitor. In other words, use of magnetic material and/or non-magnetic material for the insulation layers 6 can vary the characteristics of the coil such as increasing an impedance thereof.

The dielectric layer 4 constituting the capacitor can be made of any material selected among insulation material and dielectric material according to a desirable performance of the composite component. Also, if the insulation layers 6 is formed of same material as one used for the dielectric layer 4, an entire body of the composite component 1 can be made of a single material. This makes it easier to manufacture the composite component 1, as it eliminates the defects such as delamination, warpage, and the like during sintering of the composite component.

Accordingly, the foregoing structure of this invention provides a manufacturing of thin composite components of superior characteristic.

Figure 3:
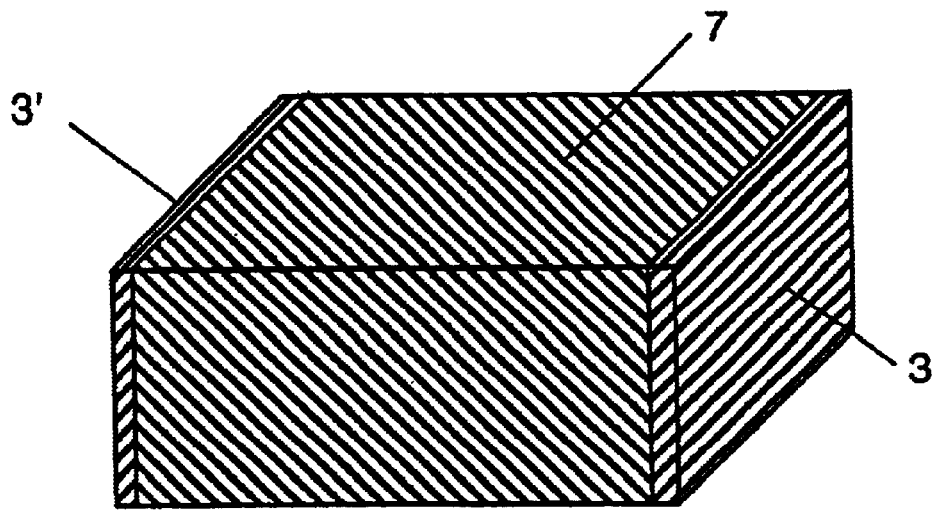
FIG. 3 is a typical external perspective view illustrating another composite component of the first exemplary embodiment of the present invention.

FIG. 3 illustrates an external shape of the composite component of FIG. 1, of which a surface other than the portions occupied by the terminals 3 and 3' is covered with an external insulation layer 7. The external insulation layer 7 is not always needed, as it depends on use application of the compound component. However, the external insulation layer 7 is necessary in order to ensure sufficient insulation of the coil, or when a change in characteristic of the coil is intended. If magnetic substance is mixed in material of the external insulation layer 7, for example, the external insulation layer 7 reduces leakage flux of the coil and may be used to adjust an electrical characteristic of the coil.

Besides, strength of the composite component can be improved by mixing ceramic materials into the external insulation layer 7, so as to protect the composite component from being damaged or becoming defective during mounting of it on a circuit board by an automated mounting machine. Or, the composite component can be shielded electrically, if it is covered with the conductive external layer 7 instead of insulation material after insulating the coil portion with an insulation material.

What has been described in the preceding paragraphs is a structure of the composite component having a filter circuit in which a coil and a capacitor are connecting in parallel. Describing next is a composite component having a filter circuit of other kinds, which is also manufactured with a method of this exemplary embodiment.

Figure 4A:
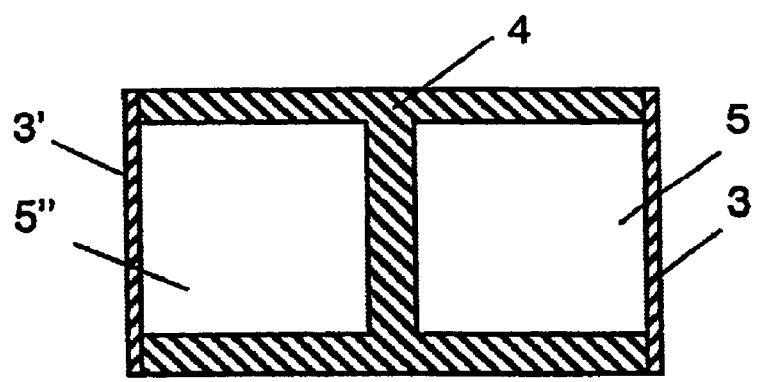
FIGS. 4A and 4B are conceptional plan views illustrating other electrode patterns of a capacitor of the first exemplary embodiment of the present invention.
Figure 4B:
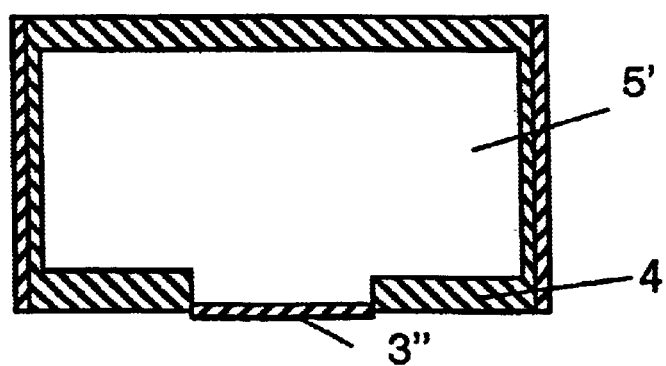

FIGS. 4A and 4B show schematic patterns of the electrode layers formed on the dielectric layer 4. The electrode layer 5 shown in FIG. 2 is divided into two electrode layers 5 and 5", and these electrode layers are connected to their respective terminals 3 and 3', as illustrated in FIG. 4A. The structure of this exemplary embodiment, in which the electrode layer 5 is divided into two separate layers 5 and 5", and connected respectively to the terminals 3 and 3,' can provide a composite component having a π-type filter circuit.

Figure 5A:
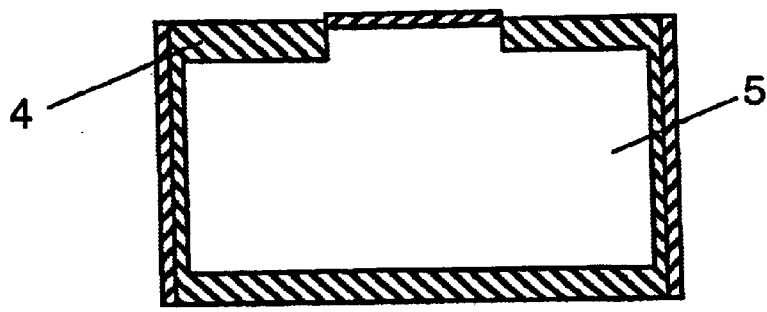
FIGS. 5A and 5B are conceptional plan views illustrating still other electrode patterns of a capacitor of the first exemplary embodiment of the present invention.
Figure 5B:
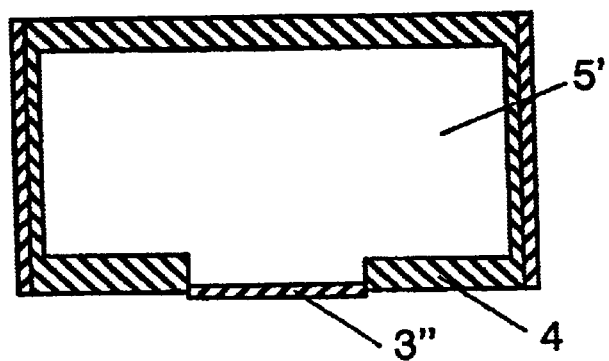
Figure 6:
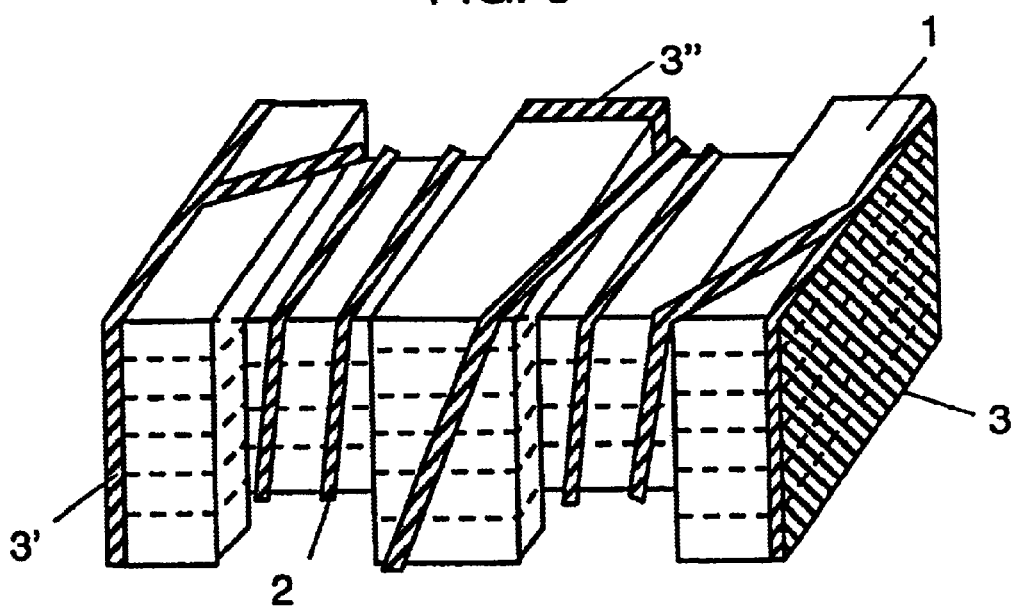
FIG. 6 is a typical external perspective view illustrating still another composite component of the first exemplary embodiment of the present invention.

Furthermore, a T type filter circuit can be constructed by exposing a leading conductor portion of the electrode layers 5 and 5' at each side orthogonal to the terminals 3 and 3' of the composite component, connecting a midpoint of the conductor 2 to the lead conductor of the electrode layer 5, and providing a terminal 3" for connecting the lead conductor of the electrode layer 5', as shown in FIGS. 5A, 5B and 6.

A method of manufacturing the composite component of this exemplary embodiment and materials used for it will be described hereinafter in more details by referring to FIG. 2.

The method of manufacturing the composite component of this exemplary embodiment comprises a first step of forming a capacitor; a second step of forming insulation layers on upper and lower surfaces of the capacitor; a third step of covering the composite component on its whole surface with a conductive layer; and a fourth step of finishing a few terminals and a coil out of the conductive layer formed in the third step.

First, a sheet of dielectric material and a sheet of insulation material are manufactured in order to make the dielectric layer 4 and the insulation layer 6 shown in FIG. 2. A number of dielectric sheets and insulation sheets of a predetermined dimensions are cut out of the sheet of dielectric material and the sheet of insulation material, and electrode layers 5 and 5' of a predetermined pattern are formed on the dielectric sheets and the insulation sheets.

A capacitor element of single-piece structure is manufactured by laminating (a) an insulation sheet, (b) a second insulation sheet or a dielectric sheet whereon the electrode layer 5' is formed, (c) a dielectric sheet whereon the electrode layer 5 is formed, and (d) another insulation sheet, in this order.

Subsequently, a conductive layer is formed on an entire surface of the capacitor element, and terminals 3 and 3' and a coil 2 are constructed by patterning the conductive layer.

A composite component of this invention is completed when an exterior insulation layer 7 is formed on the surface area not occupied by the terminals 3 and 3' of the composite component, if required.

Materials to be used for the above process will be described hereinafter.

Material of the insulation layer 6 can be either non-magnetic materials or magnetic materials. Some of the non-magnetic materials are usable for the insulation layer 6 which includes organic insulation material such as epoxy resin and glass fiber composite, polyimide resin, and the like, glass material, glass and ceramics composite, and a variety of ceramics. Any material can be used for the insulation layer 6, so long as it has an electrical insulating property. Use of a non-magnetic material for the insulation layer 6 increases a self-resonance frequency of the coil.

Some examples of the magnetic substances usable for the insulation layer 6 include Ni—Zn ferrite, Ni—Zn—Cu ferrite, and the like, which are generally known for having a great magnetic permeability. Use of magnetic material having a great permeability such as those substances for the insulation layer 6 can increase inductance of the coil.

Material of the conductor 2 and the electrode layers 5 and 5' can be of any material so long as it is a good electrical conductor. In consideration of cost, etc. however, copper, silver, silver palladium alloy and the like material are usually desirable.

There are basically two methods of forming the conductor 2 and the terminals 3 and 3'. One of the methods is to form the conductor 2 and the terminals 3 and 3' by patterning, after forming a ground layer consisting of an insulation material over the entire surface of the composite element made of the laminated capacitor and the insulation layers, and a layer of conductive material such as copper. Means for the patterning include a method using a laser for evaporating an unnecessary portion, a method of machine cutting, and an etching method in which an etching resist is applied on the necessary portion of the conductive layer.

Some of the methods of forming a conductive layer on the entire surface includes a variety of electroless plating methods, a method of dipping into conductive resin, and vacuum plating methods such as sputtering or a CVD method of various kinds. Among the above methods, a combination of the sputtering and the electro-plating is the most efficient way to form a conductive layer.

Other methods of forming the conductor 2 and the terminals 3 and 3' are such that a conductive layer is selectively formed only on a portion of the conductor 2 and exposed portions of the electrode layers 5 and 5' on the surface of the composite element.

Means of forming the conductive layer includes coating of conductive resin and a laser CVD method, for depositing a conductive layer only on portion for the conductor 2 and the terminals 3 and 3'.

In addition, it is also possible to form a conductor of a predetermined pattern on the surface of a composite element using a vacuum plating method such as sputtering and CVD or a wet plating method, after the undesired portions on the surface of composite element are coated with resist.

The terminals 3 and 3' are made of the same material as the conductor 2 in principle. Unlike the conductor 2, however, it is desirable to construct the terminals with a plurality of layers using different material from that of the conductor 2, if they are used as terminals of the composite component. In specific, a desirable structure of the terminals of the composite component of this invention consists of a ground layer made of copper, silver, silver palladium alloy, or the like material, an intermediate layer formed by nickel plating, and an outer layer made of tin or an alloy thereof. However, this composition is only one example, and other metals or organic material, e.g. conductive resin, and the like can be chosen as a part of the composing materials of the terminals 3 and 3'.

If the terminals 3 and 3' are formed with conductive resin, they need to be additionally overlaid with another layer of metallic substance such as those described in the preceding paragraphs by means of electro-plating or the like method in order to ensure solderability. However, there are cases that the composite components are mounted with conductive resin for a purpose of lead-free manufacturing. If composite components of this invention are used in such cases, the above-described metal plating is unnecessary.

As another example of using composite components of this invention, there are also cases that the composite components are mounted on a ceramic substrate such as alumina or ferrite, on which a wiring pattern is formed in advance, using high-temperature sintering paste. If this is the case, material of the terminals 3 and 3' needs to have a heat resisting property in order to withstand to the sintering temperature.

Dielectric material composed of well-known organic or inorganic material can be used for the dielectric layer 4. Using material having a large dielectric constant as the dielectric layer 4 can increase the capacitance of the capacitor. In addition, the capacitance of the capacitor can be changed by varying a area of the electrode layers 5 and 5', or a thickness of the dielectric layer 4, both of which constitute the capacitor, even if the same dielectric material is used.

Incidentally, a structure shown in FIG. 2 represents a minimum structure necessary for the composite component of the present invention. In other words, a capacitance of the capacitor can be increased by increasing the laminated structure of capacitors, each of which comprises a combination of the dielectric layer 4 and the electrode layers 5 and 5'. In case of making such a structure, electrodes 5, 5', 5", 5"', etc. are led out alternately to two sides, and they are respectively connected to the terminals 3 and 3'. Moreover, insulation layers 6 composed of magnetic material may be laminated on both upper and lower sides of the capacitor, as has been described, in order to improve an electrical characteristic of the coil.

One of the important electrical characteristics of the L/C composite component for noise reduction, especially T-type and π-type filters, is a cut-off frequency. The cut-off frequency is defined as a frequency at which a fixed value of attenuation is obtained, and it is determined by an inductance of the coil and a capacitance of the capacitor. For the composite component of this invention, as has been obvious from the foregoing, an inductance of the coil and a capacitance of the capacitor can be changed easily. Accordingly, the invention provides an easy manufacturing method of filters having a wide range of cut-off frequencies.

Further, when manufacturing a composite component having a filter circuit, which requires a plurality of capacitors, the composite component of this invention can easily provide the plurality of capacitor elements formed on a surface of a single layer, as shown in FIG. 4. Unlike the conventional laminated composite component, therefore, the composite component of this invention has such advantages that it is easy to manufacture, and it only requires a few changes such as a change in the printing pattern in order to manufacture L/C filters of many kinds.

Although what has been described is the composite component having a structure of a surface-mount component, in which terminals are formed directly on side surfaces thereof, it can be made into a composite component with pin terminals or lead wire type components with caps instead of the above described terminals.

When the capacitor is composed of ceramic material, a sintering process is necessary in addition to the laminating process. Details of a method of manufacturing a composite component having a capacitor composed of ceramic material will be described hereinafter.

The insulation layer 6 and the dielectric layer 4 may be formed by such method as green-sheet forming, printing, dipping, powder forming, spin-coating, and the like. The electrode layers 5 and 5' are usually formed by a printing method.

Paste or slurry for use in forming each of the foregoing layers is produced by mixing and dispersing powder having a suitable property, sintering aid agent, inorganic binding agent, or binding resin, and plasticizer, dispersant, etc. as needed, into solvent.

A sintering temperature of the capacitor lies within a range of from 800° C. to 1300° C. The sintering temperature determines materials that can be used for the conductor. If silver is used for the conductor material, for example, the sintering temperature of the composite component is restricted by an upper limit or approx. 900° C. On the other hands, the composite component can be sintered at 950° C., if silver-palladium alloy is used for the conductor. If it is necessary to sinter the composite component at even a higher temperature, the conductor material of nickel, palladium, or the like materials must be used. The exemplary embodiments will be described more precisely with the following exemplary embodiments.

FIRST EXEMPLARY EMBODIMENT

EXAMPLE 1

First, dielectric slurry was manufactured by mixing and dispersing in a pot mill, 100 g of titanium oxide powder, 8 g of butyral resin, 4 g of butyl benzyl phthalate, 24 g of methyl ethyl ketone, and 24 g of butyl acetate.

Next, dielectric green sheets having a thickness of 0.2 mm were produced by coating the dielectric substance slurry on PET films using a blade coater, followed by drying.

Electrode layers 5 and 5' were produced by screen-printing commercially available silver paste on the dielectric green sheets.

The dielectric green sheets 4 and 6 formed thereon with the electrode layers 5 and 5' were laminated together with other dielectric green sheets not bearing electrode layers, as an alternative to the insulation layers 6, as shown in FIG. 2, and they were formed into a single-piece body by a heat-press under a condition of 100° C. and 500 Kg/cm$^2$.

A capacitor element was completed after the single-piece body of dielectric green sheets was sintered at 900° C. for 2 hours. The capacitor element was then copper-plated with electroless plating and barrel plating, to form a copper film over an entire surface of the capacitor element.

A spiral conductor 2 as shown in FIG. 1 was formed to construct a coil integrated with terminals by irradiation of a laser beam on the copper film formed on the surface of the capacitor element. The composite component of this invention was completed upon formation of this coil.

The composite component manufactured in the foregoing process showed superior electrical characteristics when it was subjected to a measurement of various electrical characteristics with an impedance analyzer and a network analyzer.

EXAMPLE 2

Another composite component was manufactured with the same process as that described in the first embodiment, except that ferrite green sheets were used as the insulation layers 6 instead of the dielectric green sheets not formed with electrode layers.

The ferrite green sheets were manufactured by a process described below.

First, ferrite slurry was manufactured by mixing and dispersing in a pot mill, 100 g of Ni—Zn—Cu ferrite powder, 8 g of butyral resin, 4 g of butyl benzyl phthalate, 24 g of methyl ethyl ketone, and 24 g of butyl acetate.

Next, ferrite green sheets having a thickness of 0.2 mm were produced by coating the ferrite slurry on PET films using a blade coater, followed by drying.

The composite component manufactured in this experimental embodiment did not exhibit any defects such as delamination, crack, warpage, or the like. The composite component obtained here showed superior electrical characteristics when it was subjected to a measurement of various electrical characteristics with an impedance analyzer and a network analyzer.

Furthermore, a surface of the composite component was coated to form an exterior insulation layer 7, as shown in FIG. 3, so that only the terminals 3 and 3' were exposed. Two kinds of material were used for the insulation layer 7, a thermosetting resin, and a mixture of thermosetting resin and ferrite powder. The composite components with surfaces of excellent insulation were obtained with both materials.

EXAMPLE 3

In the composite component of the second embodiment, the electrode layer 5 to be formed on the dielectric layer 4 was divided into two separate forms, as shown in FIG. 4A, and another electrode layer 5' was altered in shape so that it was connected to a terminal 3" in a center of the composite component as shown in FIG. 4B. This embodiment provided the composite component having a π-type filter circuit.

EXAMPLE 4

A composite component was manufactured by the same method as used in the second embodiment, except that the electrode layers 5 and 5' to be formed on the dielectric layers 4 were altered into shapes shown in FIGS. 5A and 5B, and a terminal 3" was added at a center of the composite component as shown in FIG. 6. In the structure of this experimental embodiment, a conductor 2 is electrically connected to a lead portion of the electrode 5 shown in FIG. 5A, and a center terminal 3" is connected to a lead portion of the electrode 5' shown in FIG. 5B. This resulted in the composite component having a T-type filter circuit.

SECOND EXEMPLARY EMBODIMENT

A second exemplary embodiment of the present invention will be described next by referring to the accompanying figures.

Figure 7:
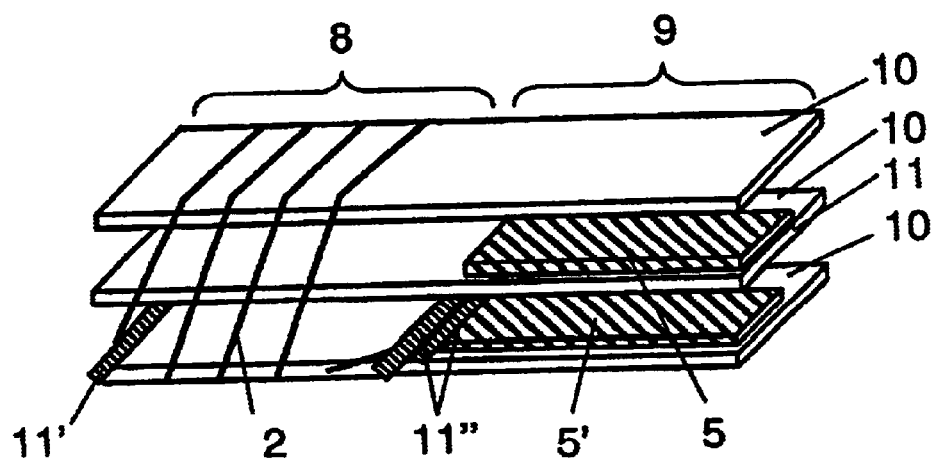
FIG. 7 is a schematic view illustrating a conceptional structure of a composite component of a second exemplary embodiment of the present invention.

FIG. 7 is a schematic view illustrating a conceptional structure of a composite component of the second exemplary embodiment of this invention. The composite component shown in FIG. 7 comprises coil 8 and capacitor 9, and lead electrodes 11, 11' and 11" for connecting to external terminals formed at both sides and a center of the composite component. The coil 8 is formed in close contact to an insulation layer 10 in the same manner as that of the first exemplary embodiment. The coil 8 may be covered with insulation material, other than portions of the lead electrodes 11' and 11", in the same manner as in the case of the first exemplary embodiment.

Also, the capacitor 9 comprises insulation layers 10 and electrode layers 5 and 5' formed thereon. An exterior surface of the electrode layers 5 and 5' may also be covered with insulation material in like manner as the coil, except for portions occupied by the lead electrodes 11 and 11'.

Both ends of conductor 2, which constitutes coil 8, are connected to lead electrodes 11' and 11", and electrode layers 5 and 5' of capacitor 9 are connected to lead conductors 11 and 11'.

Figure 8:
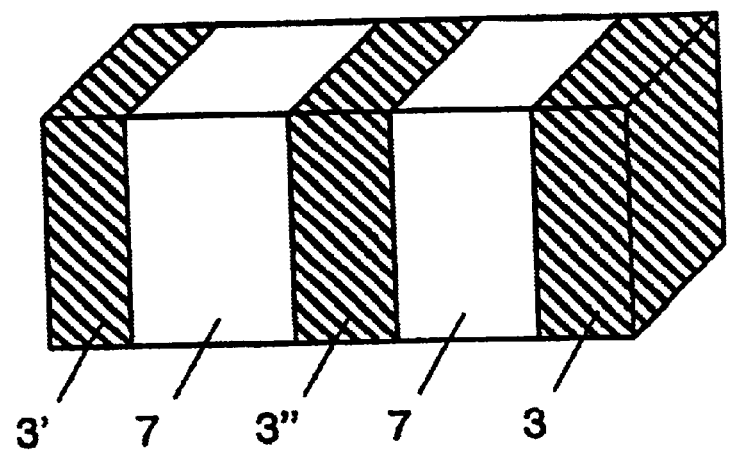
FIG. 8 is a typical external perspective view illustrating the composite component of the second exemplary embodiment of the present invention.

Lead electrodes 11 and 11' and 11" are connected respectively to terminals 3, 3' and 3" of the composite component of this exemplary embodiment, which is shown in FIG. 8. In FIG. 8, an entire surface of the composite component except terminals 3, 3' and 3" is covered with exterior insulation layer 7. All materials and processes used for the composite component of this exemplary embodiment are the same as those of the first exemplary embodiment.

A method of manufacturing conductor 2 for constituting coil 8 and terminals 3, 3', and 3" remains unchanged from that of the first exemplary embodiment. For instance, conductor 2 and terminals 3, 3', and 3" can be constructed by forming a conductive layer on an entire surface of the composite element, in which the internal capacitor and the lead electrodes are produced in advance, and the conductive layer is patterned thereafter. It is desirable that surfaces of terminals 3, 3', and 3" are additionally covered with an intermediate layer of nickel, and an outermost layer of tin or an alloy thereof; both of these layers are made by plating.

Figure 9:
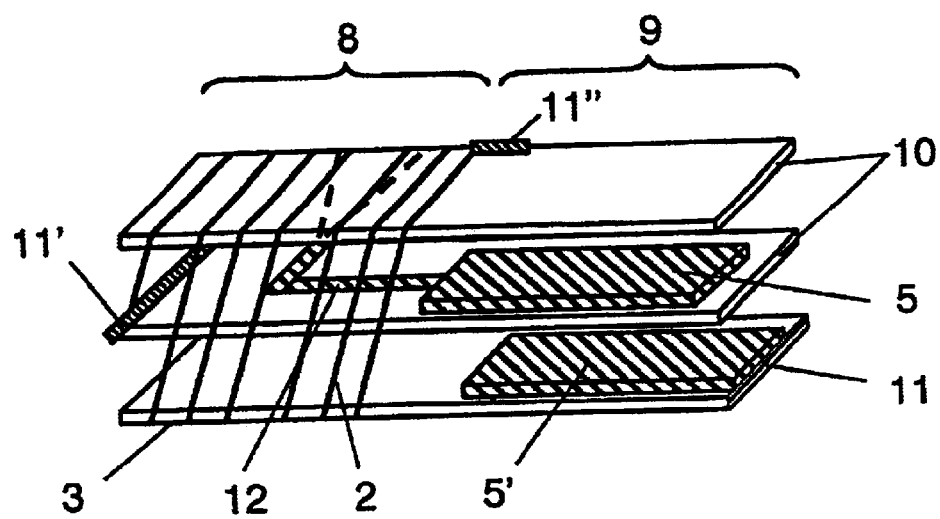
FIG. 9 is a schematic view illustrating a conceptional structure of another composite component of the second exemplary embodiment of the present invention.
Figure 10:
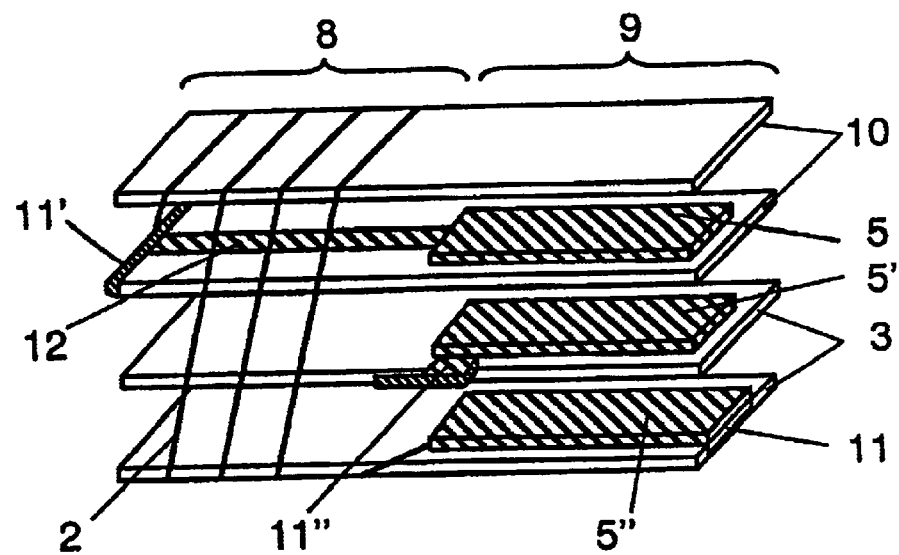
FIG. 10 is a schematic view illustrating a conceptional structure of still another composite component of the second exemplary embodiment of the present invention.

Although, a structure shown in FIG. 7 constitutes an L-type filter circuit, the same structure can constitute a T-type filter circuit by drawing out lead conductor 12 from electrode layer 5, and connecting it to a midpoint of conductor 2 composing coil 8, as shown in FIG. 9. Moreover, the structure can also constitute a π-type filter circuit by drawing out lead conductor 12 from electrode layer 5, connecting it to a lead electrode 11', and drawing out another lead electrode 11" from electrode layer 5', as shown in FIG. 10.

As is obvious from the foregoing exemplary embodiment, many kinds of filter circuits can be manufactured by making a slight change in a printing pattern of the electrodes. In the described exemplary embodiment, and in FIGS. 7, 9, and 10, although the capacitor and the coil are shown in a side-by-side arrangement, they can be arranged in a fore-and-aft or a stacked orientation.

THIRD EXEMPLARY EMBODIMENT

Figure 11:
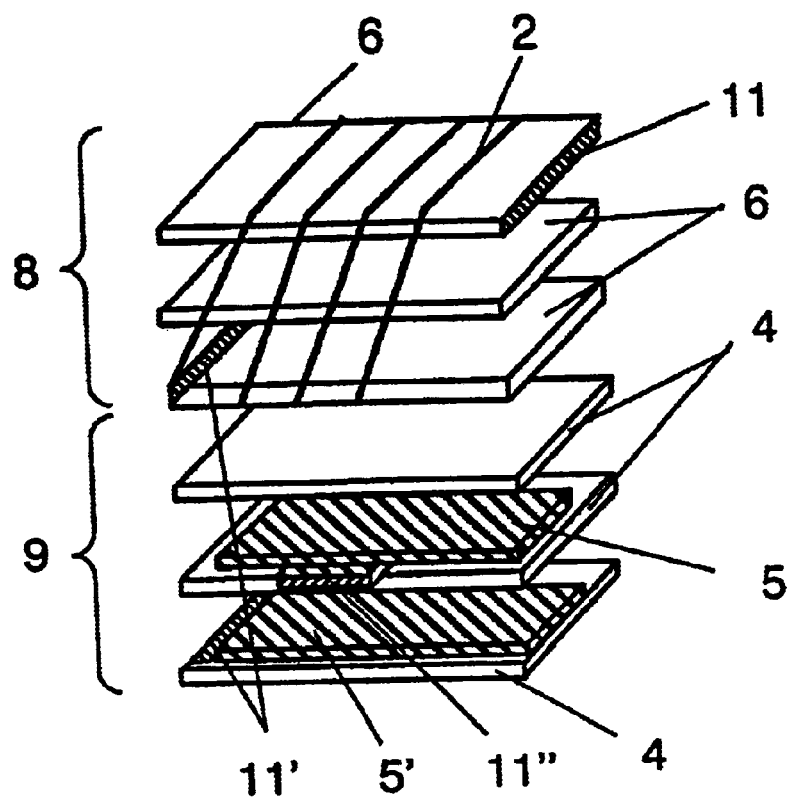
FIG. 11 is a schematic view illustrating a conceptional structure of a composite component of a third exemplary embodiment of the present invention.

FIG. 11 is a schematic view illustrating a schematic structure of a composite component of a third exemplary embodiment of the present invention. The composite component of this exemplary embodiment has a structure wherein coil 8 and capacitor 9 are laminated together. Coil 8 comprises a plurality of insulation layers 6, and conductor 2 formed in close contact to a periphery of insulation layers 6, and capacitor 9 comprises dielectric layers 4 and electrode layers 5 and 5'.

Both ends of conductor 2, composing coil 8, are connected to lead electrodes 11 and 11', and two electrode layers 5 and 5', composing the capacitor, are connected to lead electrodes 11" and 11' respectively.

Figure 12:
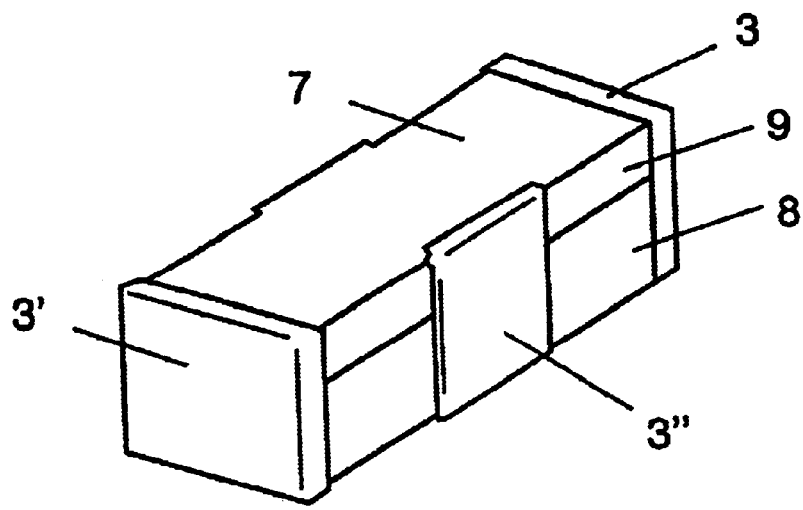
FIG. 12 is a typical external perspective view illustrating the composite component of the third exemplary embodiment of the present invention.

Lead electrodes 11, 11' and 11" are connected respectively to terminals 3, 3', and 3" of the composite component of this exemplary embodiment, which is shown in FIG. 12. In FIG. 12, an entire surface of the composite component except terminals 3, 3', and 3" may be covered by exterior insulation layer 7.

Although FIG. 11 illustrates a plurality of insulation layers 6, coil 8 can be constructed with a single piece of insulation layer 6 so long as it is rigid and strong enough to withstand a process of forming the coil. All materials, processes and exterior insulation used for the composite component of this exemplary embodiment are the same as those of the first and second exemplary embodiments.

A method of manufacturing conductor 2 for constituting the coil remains unchanged from that of the first exemplary embodiment. That is, a plurality of insulation layers 6 made of magnetic material or insulative material are laminated together, and a coil is formed on a periphery thereof, in the same manner as the first exemplary embodiment. Manufacture of the composite component is completed thereafter, when the coil is laminated over separately prepared capacitor 9.

A difference between the composite component of this exemplary embodiment and those of the prior art are that this exemplary embodiment allows manufacturing of a large variety of coils and capacitors using the same design rules, and resulting in coils of high Q. In other words, the coils of this exemplary embodiment differ in direction of magnetic flux by 90 degrees from that of the printed and laminated coils of the prior art. For this reason, a cross-sectional area and a length of the magnetic material used for the coils can be increased easily as compared to the prior art coils, thereby obtaining a high Q.

Figure 13:
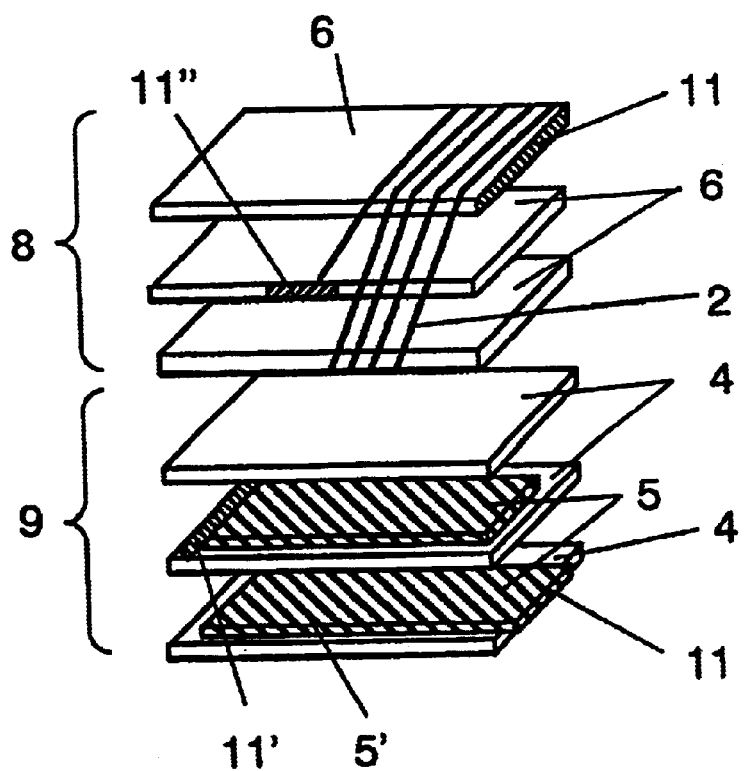
FIG. 13 is a schematic view illustrating a conceptional structure of another composite component of the third exemplary embodiment of the present invention.
Figure 14:
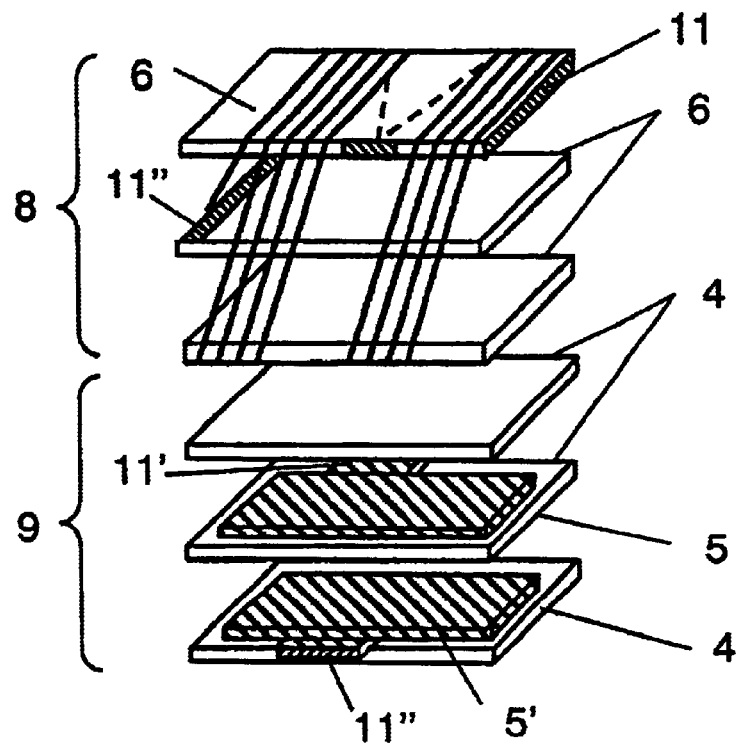
FIG. 14 is a schematic view illustrating a conceptional structure of still another composite component of the third exemplary embodiment of the present invention.

While the structure shown in FIG. 11 constitutes an L-type filter circuit, FIG. 13 also shows another filter circuit of L-type. In addition, a T-type filter circuit can be manufactured by drawing out a lead conductor 12 from the electrode layer 5, and connecting it to a midpoint of the conductor 2, as shown in FIG. 14.

Figure 15:
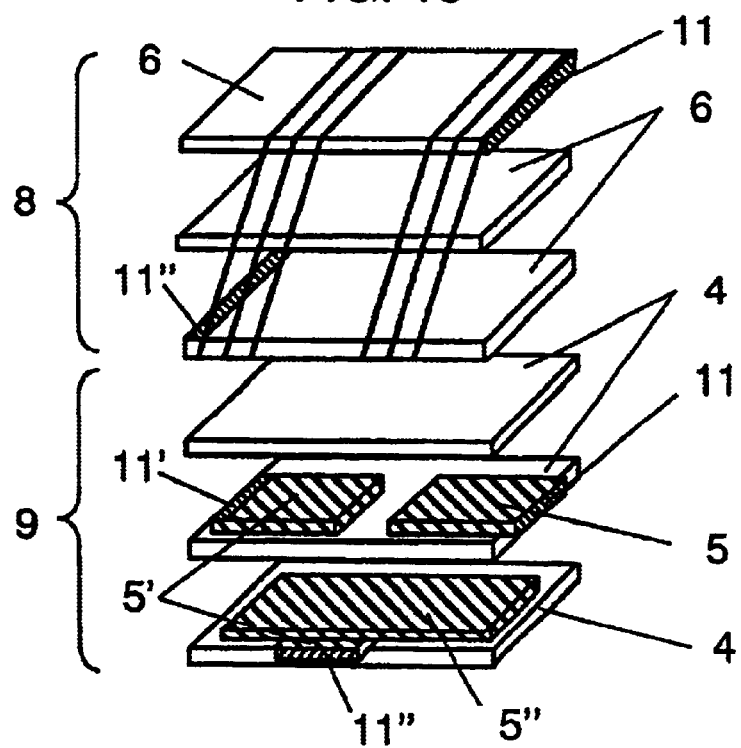
FIG. 15 is a schematic view illustrating a conceptional structure of yet another composite component of the third exemplary embodiment of the present invention.

Furthermore, a π-type filter circuit can also be manufactured by dividing the electrode layer 5 into two sections, and drawing out lead electrode 11" from electrode layer 5' as shown in FIG. 15.

As is obvious from the foregoing exemplary embodiment, many kinds of the filter circuits can be manufactured by making a slight change in a printing pattern of the electrodes.

The present invention provides a composite component, which is thin in size, superior in performance, and contains a filter circuit of various kinds. The present invention also provides a method of manufacturing the composite component effectively and easily. Accordingly, the present invention is extremely valuable for the related industry.

What is claimed is:

1. A composite component comprising:
    a capacitor element comprising at least one insulation layer and at least two electrode layers;
    a helical conductor strip comprising at least a helical conductor material and located on at least an external peripheral surface of said capacitor element, said helical conductor strip being in close contact with said external peripheral surface; and
    a plurality of terminals each comprising at least one layer comprising said helical conductor material and located on an external peripheral surface of said composite component, wherein:
        said electrode layers and said helical conductor strip are electrically connected to said plurality of terminals, and
        said helical conductor strip and said at least one layer of each terminal are electrically connected.

2. The composite component according to claim 1, wherein said helical conductor strip is constructed of a same material as the composite component terminals.

3. The composite component according to claim 1, wherein a helical axis of said helical conductor strip is parallel with said electrode layers.

4. The composite component according to claim 1, comprising a plurality of capacitors.

5. The composite component according to claim 1, wherein said helical conductor comprises two ends and a portion therebetween, and said helical conductor strip is electrically connected with said plurality of terminals at two ends and said portion.

6. The composite component according to claim 1, wherein said helical conductor strip and at least one of said electrode layers are electrically connected to one of said terminals.

7. The composite component according to claim 1, wherein an entire surface thereof other than portions occupied by said terminals is covered by an external insulation layer.

8. The composite component according to claim 7, wherein said external insulation layer comprises magnetic material powder and/or ceramic powder.

9. The composite component according to claim 7, wherein said external insulation layer is covered with conductive material.

10. A composite component comprising:
    a helical conductor strip comprising at least a helical conductor material and located on a peripheral surface of a component body, said component body being an insulation body, said helical conductor strip being in close contact with said component body;
    an insulation layer located on said helical conductor strip; and
    a capacitor comprising at least one capacitor insulation layer and at least two electrode layers comprising at least the helical conductor material, said capacitor being located on said insulation layer, wherein:
        a helical axis of said helical conductor strip is parallel with a plane of said electrode layers, and said electrode layers comprising at least the helical conductor material and said helical conductor strip are electrically connected.

11. A method of manufacturing a composite component comprising:
    forming a capacitor comprising at least one insulation layer and at least two electrode layers;
    forming an additional insulation layer on an external peripheral surface of said insulation layer and covering said capacitor; and forming a helical conductor strip and at least one terminal on an external periphery of said covered capacitor, said helical conductor strip and said at least one terminal comprising at least one layer of the same material and electrically connected together.

12. The method of manufacturing a composite component according to claim 11, wherein forming said helical conductor strip and terminal comprises:

forming a conductive layer on the external periphery of said covered capacitor, and laser machining said conductive layer.

13. The method of manufacturing a composite component according to claim 11, where informing said helical conductor strip and said terminal comprises:

forming a conductive layer on the external periphery of said covered capacitor, and machine-cutting said conductive layer.

14. The method of manufacturing a composite component according to claim 11, wherein forming said helical conductor strip and said terminal comprises:

forming a conductive layer on the external periphery of said covered capacitor, and wet-etching said conductive layer.

15. The method of manufacturing a composite component according to claim 11, wherein forming said helical conductor strip and said terminal comprises:

covering with a mask a surface portion other than surface areas where said terminals and said helical conductor strip are formed on the peripheral surface of said covered capacitor, and forming a conductor portion of said helical conductor strip on said surface areas not covered by said mask.

16. The method of manufacturing a composite component according to claim 15, wherein forming a conductor portion of said helical conductor strip comprises vacuum-plating or wet-plating.

17. The method of manufacturing a composite component according to claim 11, wherein forming said helical conductor strip and said terminal comprises:

forming a conductor with conductive paste on surface areas where said terminals and said helical conductor strip are formed on the external periphery of said covered capacitor, and forming a plated layer on the conductor formed by said conductive paste.

18. A method of manufacturing a composite component comprising:

forming a capacitor comprising at least one insulation layer and at least two electrode layers located on a portion of said insulation layer;

forming an additional insulation layer on an external peripheral surface of said insulation layer and said capacitor; and forming a helical conductor strip and at least one terminal on an external periphery of said additional insulation layer, said helical conductor strip and said at least one terminal comprising at least one layer of the same material and electrically connected together.

19. A method of manufacturing a composite component comprising:

forming a capacitor comprising at least one insulation layer and at least two electrode layers;

forming a helical conductor strip in close contact with an external periphery of a component body, said component body being an insulation body, said helical conductor strip and said at least two electrode layers comprising at least one layer of the same material and electrically connected together; and laminating said capacitor and said component body, on which said helical strip of conductor is closely formed, via another insulation layer located therebetween.

20. The composite component according to claim 10, wherein the component body comprises a magnetic body.

21. The method of manufacturing a composite component according to claim 19, wherein the component body comprises a magnetic body.

* * * * *

UNITED STATES PATENT AND TRADEMARK OFFICE
CERTIFICATE OF CORRECTION

PATENT NO. : 6,825,748 B1
DATED : November 30, 2004
INVENTOR(S) : Akihiko Ibata et al.

It is certified that error appears in the above-identified patent and that said Letters Patent is hereby corrected as shown below:

Column 13,
Line 8, after "and" insert -- said --.
Line 13, change "where informing" to -- wherein forming --.

Signed and Sealed this

Nineteenth Day of April, 2005

JON W. DUDAS
*Director of the United States Patent and Trademark Office*